March 17, 1970 J. S. REESE ET AL 3,501,685

FM DIGITAL CIRCUIT FOR ANALOG POWER CONTROL

Filed Feb. 13, 1967 2 Sheets-Sheet 1

INVENTORS
JOHN S. REESE
NEVILLE L. DOWNS
BY Hopgood & Calimafde
ATTORNEYS.

March 17, 1970 J. S. REESE ET AL 3,501,685

FM DIGITAL CIRCUIT FOR ANALOG POWER CONTROL

Filed Feb. 13, 1967 2 Sheets-Sheet 2

INVENTORS
JOHN S. REESE
NEVILLE L. DOWNS
BY Hopgood & Calimafde
ATTORNEYS.

United States Patent Office 3,501,685

Patented Mar. 17, 1970

3,501,685

FM DIGITAL CIRCUIT FOR ANALOG POWER CONTROL

John Sanders Reese, St. Petersburg, and Neville L. Downs, Redington Shores, Fla., assignors to Electronic Communications, Inc.

Filed Feb. 13, 1967, Ser. No. 615,471
Int. Cl. H02m 5/40
U.S. Cl. 321—2 1 Claim

ABSTRACT OF THE DISCLOSURE

A versatile circuit usable inter alia as a regulator, audio amplifier, AM modulator, automatic power level control, and envelope distortion correcting device. The basic circuit is predicated upon the concept of using FM digital techniques for analog control and uses the basic combination of a DC to AC converter, FM discriminator and differential amplifier for comparing a control signal and a portion of the discriminator output.

This invention relates to an improvement in analog power devices such as regulators, regulated power supplies, audio amplifiers and AM modulators. The invention further contemplates a novel configuration of circuit elements which combines a plurality of such devices into a single compact highly efficient circuit.

Relatively recent developments in semiconductor design have evolved about the use of digital techniques for accomplishing a variety of analog functions. The general technique consists of imposing an analog information as modulation upon a square wave carrier, amplifying the carrier or performing some other analog function, and then extracting the information at the output. The technique is somewhat analogous to the chopper-AC amplifier approach used in DC amplifiers.

This invention proposes a digression from the basic technique in that the information is impressed upon the carrier by a non-amplitude means. Consequently, all the amplifying elements in the circuit can then function as switches, and since they are either saturated or turned off at a given time, a maximum power handling efficiency is achieved. By use of feedback, linear circuit characteristics can be obtained with extremely non-linear devices. In addition, coupling and by-pass capacitors are greatly reduced in size because they are operated at the carrier frequency instead of at the information frequency.

Accordingly, it is the object of this invention to gain a significant increase in the efficiency of regulators and regulated power supplies, audio amplifiers, AM modulators, automatic power level control and envelope distortion correcting circuits.

It is a further object of this invention to achieve the foregoing object with circuitry which is reduced in size and complexity.

It is a further object of this invention to provide an integrated arrangement for providing one or more of the foregoing functions; functions which are normally implemented separately.

It is a further object of this invention to achieve modulation without modifying the amplitude and with a reduction in AM distortion.

It is a still further object of this invention to apply the foregoing principles to obtain a regulated current supply with very high DC to DC efficiency, and with a minimum of needless dissipation in series resistances.

The above mentioned and other features and objects of this invention and the manner of attaining them will become more apparent and the invention itself will best be understood by reference to the following description of embodiments of the invention taken in conjunction with the accompanying drawings wherein.

Figure 1:
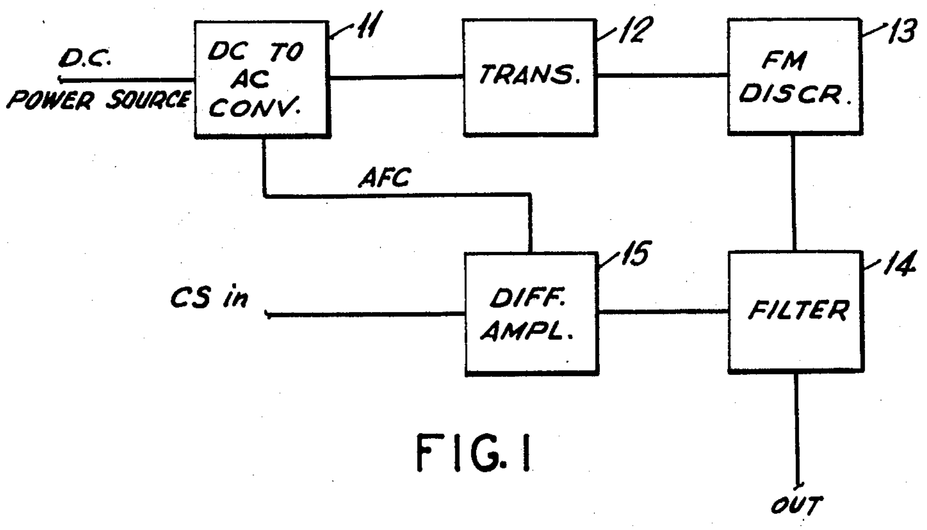
FIG. 1 shows one embodiment of the invention in block form.

Turning now to FIG. 1, the invention will first be described, using as an illustration, the application of FM digital techniques, according to the invention, to provide a regulated voltage power supply.

The DC power to be controlled is fed to a DC to AC converter 11 which is capable of being "FM'd." Such a converter may comprise a voltage controlled oscillator (VCO) which emits square, rather than sine, waves; the frequency of the waves being dependent upon the voltage being applied to a control terminal. For reasons which will be apparent subsequently, when the invention is described with respect to modulation control, the speed of response of the VCO should be relatively high to achieve quick analog response. It bears mentioning that it is not important whether the current or voltage into the converter 11 changes so long as the frequency shifts dependently.

Figure 2:
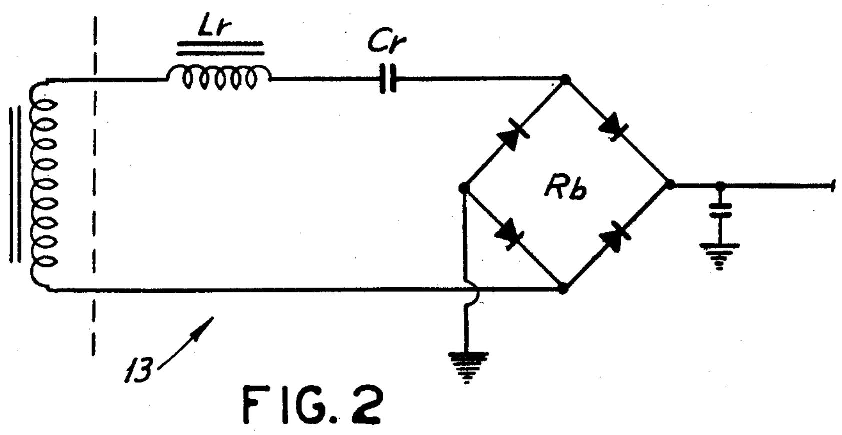
FIG. 2 is a schematic detail of the FM discriminator of FIG. 1.

The output of the converter 11 is fed to an isolating transformer 12 and then to an FM discriminator 13. Details of the FM discriminator may be seen in FIG. 2. The discriminator is of the conventional type and includes a series resonant circuit $L_T$ and $C_T$ feeding a full wave rectifier bridge $R_b$. Since this circuit is resonant at a particular frequency, its output will depend upon the departure that the converter frequency takes from resonance, the output increasing as resonance is approached. As is apparent to those skilled in the art, a parallel tuned circuit disposed across the transformer secondary would also fulfill the functional requisites.

The output of FM discriminator 13 is fed to low pass filter 14 which eliminates the harmonics and provides a DC output. Thus far, the described circuit has converted DC to DC with extremely high efficiency.

Figure 3:
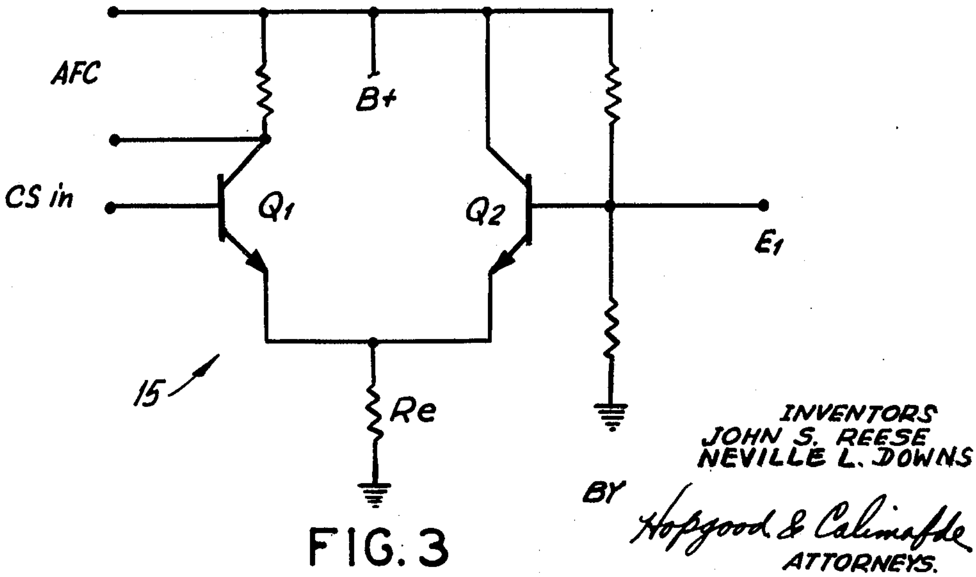
FIG. 3 is a schematic detail of the differential amplifier of FIG. 1.

The output of the filter 14 is also fed to differential amplifier 15, a second input to which is provided by a control signal input $CS_{in}$. An exemplary differential amplifier is shown in FIG. 3. The differential amplifier comprises two transistors $Q_1$ and $Q_2$ coupled through a common emitter resistance $R_e$. As is well known to those skilled in the art, such an amplifier will track the difference between the voltages applied to its inputs. Voltage $E_1$ is that obtained from the filter 14 while voltage $CS_{in}$ is the control voltage input. Any departure in voltage $E_1$ from the control voltage will cause output AFC to change correspondingly. Thus, voltage $E_1$ and the output voltage, OUT, is forced to track the reference potential $CS_{in}$. Voltage regulation is thus achieved. Suffice to say, any amplifier having a sufficiently high frequency response so that it would faithfully reproduce the excursions from the reference and cause the AFC voltage to track these excursions would be equally effective to that shown.

The described device in essence is a regulator-converter combining the functions of both regulation and conversion. Conventionally, such a device would comprise a switching regulator in series with a DC to DC converter. The highest efficiency of each of these is generally 90%; thereby affording an overall efficiency of 81%. The described arrangement, however, allows an overall efficiency of 90% since both regulation and conversion are accomplished simultaneously.

To recapitulate, in the described arrangement, the AFC is essentially a feedback arm which compensates for any variation in the input DC. When the DC input voltage attempts to increase, the DC output voltage will attempt to increase with it. Since this voltage is applied to a differential amplifier which has a DC voltage as a reference control signal, the AFC difference voltage imposes a change in frequency on the converter, moving it down the slope of the resonant curve of the FM discriminator. Consequently, the AC voltage across the rectifier bridge of the discriminator is lower and the DC output voltage is reduced.

As a second application or embodiment, consider the output signal $CS_{in}$ as an audio signal. In this case, voltage $E_1$, the output of the filter (which is modified in this case to also pass audio oscillations) attempts to track $CS_{in}$ by virtue of the AFC control voltage imposed upon the converter. Accordingly, a DC output voltage, OUT, is achieved which varies at the audio rate of the input signals $CS_{in}$. The described audio system possesses a huge amount of gain, and a one volt swing at the input at a low power level and high impedance, could produce a 20 to 30 volt output swing across a low impedance. Consequently, the device may function as an amplifier.

It is also possible to utilize the series combination of the amplifier and regulator described above. That is, if a DC voltage is applied in series with the audio amplifier, the regulation is achieved at a particular DC level with respect to any input variations and further the output is AM'd at the audio rate, such that if it is applied to the final of an RF amplifier, modulation would result. Thus, the device may be used as a high level modulator which is very efficient.

Figure 4:
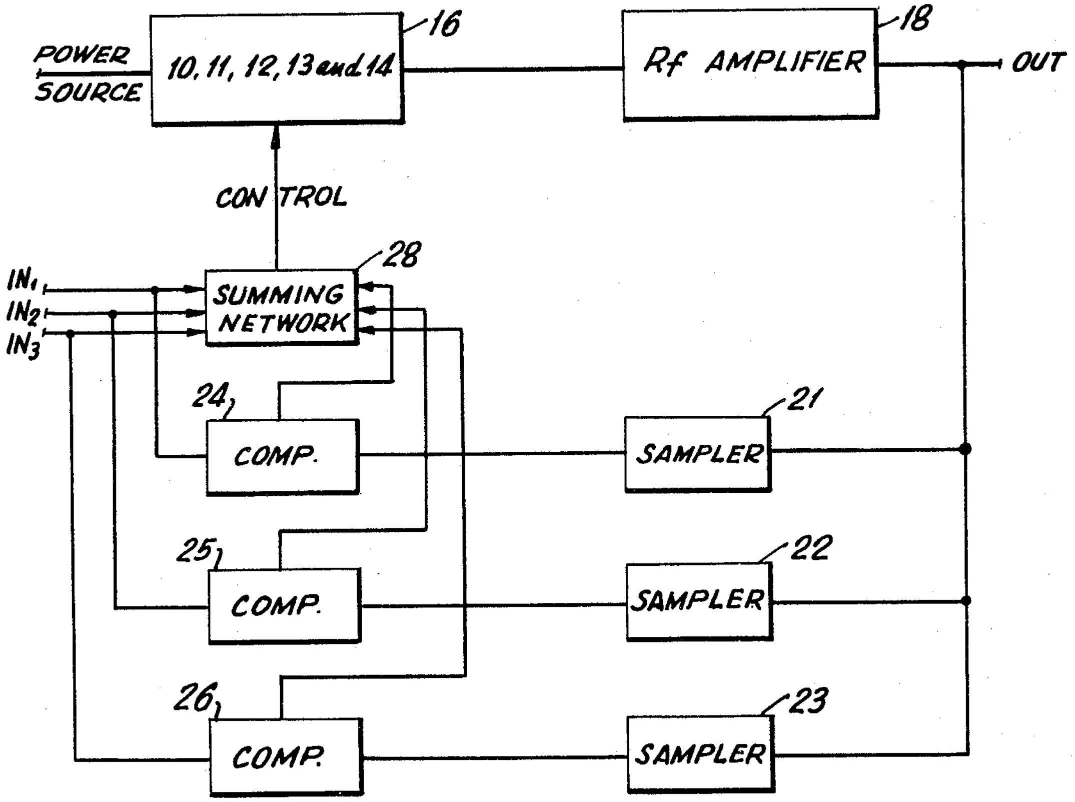
FIG. 4 shows the block form circuitry for the simultaneous implementation of several functions according to the invention.

FIG. 4 shows an arrangement for providing the analog control of a plurality of functions. In this figure, block 16 represents the DC to AC converter 10, the transformer 11, the discriminator 13, and the filter 14 of FIG. 1. Block 18 is an AC or RF source, typically on RF amplifier, whose output is a known function of the applied voltage, current and therefore, power. In other words, as the voltage is increased across source 18, the output power or current increases as a known function.

The output of the RF source 18 is the output of the device, and simultaneously feeds a plurality of sampling devices 21 to 23. Each may sample a different function. Thus, sampler 21 may sample the power level, sampler 22, the detected modulation and sampler 23 some other function. Each of the sampled signals is differentially compared to references available at inputs $IN_1$ to $IN_3$; each input corresponding to one being sampled. Thus, for example, input $IN_2$ might be a reference sine wave which would be compared in differential comparator 25 (not unlike that of FIG. 3) with the detected modulation to correct for any distortion and make the detected wave conform as nearly as possible to the modulating signal. Thus, the invention provides envelope or distortion correction.

The foregoing is premised upon the fact that assuming sinusoidal modulation, a sinusoidal variation should occur in the voltage or current emanating from block 16. Depending upon the linearity of the RF source, however, the sine wave may or may not be duplicated at the output. If it is not, the output sample fed to the comparator creates an error voltage which modifies the output of block 16.

Network 28 allows the control to take place among the functions simultaneously. It is assumed naturally that each function being controlled is not the antithesis of some other function; which might possibly result in a cancellation of control signals and output distortion notwithstanding correction.

Figure 5:
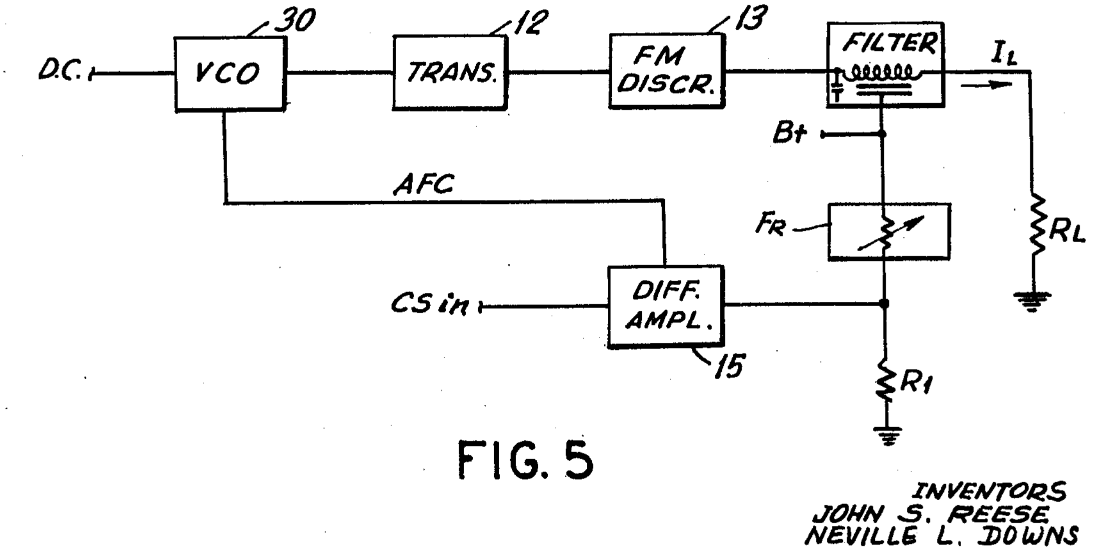
FIG. 5 shows, in block form, a switching current regulator according to the invention.

FIG. 5 shows a high efficiency current regulator employing the concept of the invention. In this embodiment, since the invention contemplates working at power levels, the VCO includes a power amplifier. It is to be understood, however, that the voltage regulator embodiment of FIG. 1 may also employ power amplification means. As with the embodiment of FIG. 1, the output of the VCO feeds an isolation transformer and FM discriminator, 12 and 13, respectively. The output from the FM discriminator is fed to filter 14' which in the preferred arrangement serves as a source for a current sample.

The current sample is obtained by utilizing a small gap in the torroidal core of the filter choke for a Hall effect device. Since a Hall effect device inherently has a resistance which varies in proportion to the flux flowing through it, and the flux is proportional to the current flowing through the filter, there is a linear dependency of resistance upon the sampling current. In effect, a flux variable resistor $F_r$ is produced which may be employed in a voltage divider circuit including resistance $R_1$ and source B+ to provide one input to the differential amplifier 15. The differential amplifier then may function similarly to that in FIG. 1 to provide an AFC voltage for controlling the VCO. Thus, a highly efficiency current regulator is obtained with a minimum loss in series resistances.

It may be seen that the foregoing approach of using FM digital techniques for analog control, results in several worthwhile advantages in both circuit simplification and efficiency.

What is claimed is:

1. A circuit for simultaneously controlling a plurality of functions comprising:

DC to AC converter means frequency dependent upon a control voltage applied thereto;

means coupled to said converter for deriving a DC voltage dependent upon the frequency thereof;

a plurality of control signal inputs;

a plurality of signal sample means, each for deriving the respective function to be controlled;

a plurality of differential comparators each coupled between a control signal input and a corresponding sample means for producing an output control voltage dependent upon the respective variations therebetween;

means for summing the differential comparator outputs; and means for applying said sum as a control voltage to said DC to AC converter.

References Cited

UNITED STATES PATENTS

| | | | |
|---|---|---|---|
| 3,027,508 | 3/1962 | Johnson | 321—19 |
| 3,109,133 | 10/1963 | Mills | 321—18 X |
| 3,248,637 | 4/1966 | Albert et al. | 321—2 X |
| 3,320,510 | 5/1967 | Locklair | 321—2 |
| 3,388,318 | 6/1968 | O'Brien | 323—94 |

OTHER REFERENCES

IBM Technical Disclosure Bulletin, "Regulated Power Supply," vol. 7, No. 10, March 1965, p. 967.

LEE T. HIX, Primary Examiner

W. H. BEHA, Assistant Examiner

U.S. Cl. X.R.

321—18, 19